United States Patent [19]

Adams

[11] Patent Number: 4,655,088

[45] Date of Patent: Apr. 7, 1987

[54] UNIBODY PRESSURE TRANSDUCER PACKAGE

[75] Inventor: Victor J. Adams, Tempe, Ariz.

[73] Assignee: Motorola, Inc., Schaumburg, Ill.

[21] Appl. No.: 784,980

[22] Filed: Oct. 7, 1985

[51] Int. Cl.⁴ .......................... G01L 19/14; G01L 9/00
[52] U.S. Cl. ........................................ 73/756; 73/431;
73/717; 73/723; 73/DIG. 4
[58] Field of Search .................... 73/DIG. 4, 431, 754,
73/753, 723, 727, 717, 720, 756; 128/675, 673,
748

[56] References Cited

FOREIGN PATENT DOCUMENTS 0025680 2/1977 Japan ..................................... 73/754

Primary Examiner—Donald O. Woodiel
Attorney, Agent, or Firm—Joe E. Barbee

[57] ABSTRACT

A one piece housing suitable for housing semiconductor chips is molded from a polymer material. Electrical leads pass through a molded one piece housing to provide electrical contact between the semiconductor die and external circuitry. A hole can be provided in the bottom of the package if the package is to be used as a unibody pressure transducer package.

5 Claims, 3 Drawing Figures

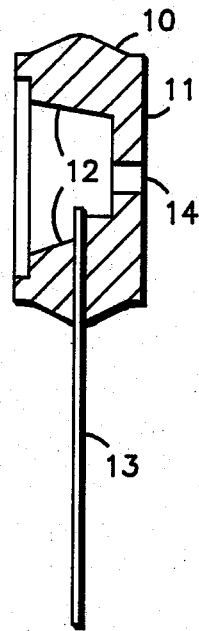
FIG. 1
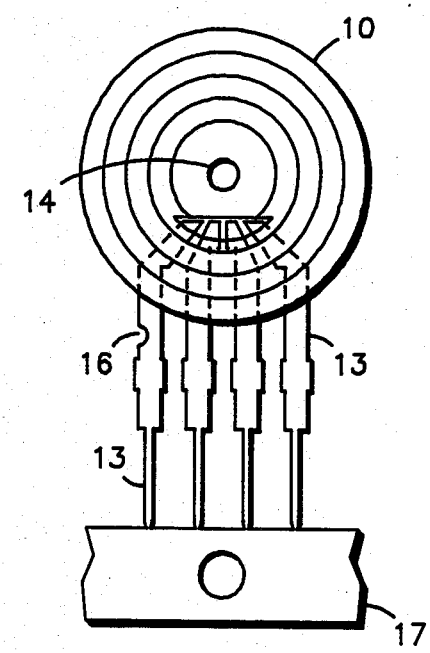
FIG. 2
FIG. 3
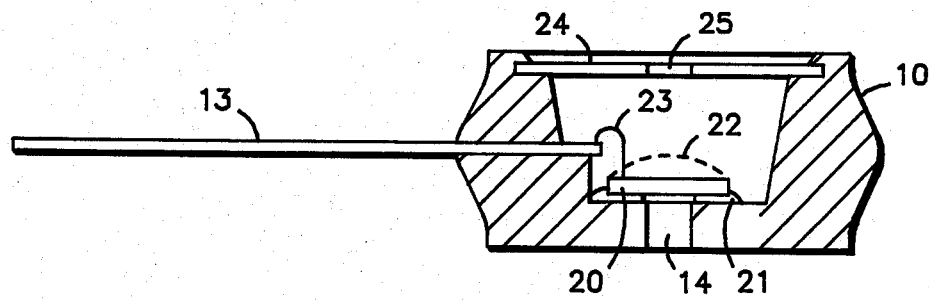

UNIBODY PRESSURE TRANSDUCER PACKAGE

BACKGROUND OF THE INVENTION

This invention relates, in general, to pressure transducers, and more particularly, to a unibody pressure transducer package.

Semiconductor pressure transducers have been around for some time, and are generally packaged in a two piece housing. The two piece housing consisted of a base on which a semiconductor pressure transducer was mounted and the base was inserted within a donut-shaped molded plastic wallframe. The wallframe had leads for making electrical connection to the semiconductor pressure transducer protruding through the donut-shaped wallframe. The base had to be bonded to the donut-shaped wallframe in a manner to provide a leak proof seal between the base and the wall. A continual search for lower cost and improved packaging has overcome some of the problems with the two piece housing.

Accordingly, it is an object of the present invention to provide an improved pressure transducer package.

Another object of the present invention is to provide a unibody pressure transducer package.

SUMMARY OF THE INVENTION

The above and other objects and advantages of the present invention are provided by a unibody structure consisting of a leadframe insert molded into a one piece housing made of a polymer material. A semiconductor chip or die is placed in the one piece housing and electrically connected to the leadframe. A hole through the one piece housing is located beneath the semiconductor chip.

The subject matter which is regarded as the invention is set forth in the apended claims. The invention itself, however, together with further objects and advantages thereof, may be better understood by referring to the following detailed description taken in conjunction with the accompanying drawings.

BRIEF DESCRIPTION OF THE DRAWINGS

FIG. 1 is a cut-away side view of an embodiment of the present invention;

FIG. 2 is a plan view of the unitary housing shown in FIG. 1; and

FIG. 3 is a cut-away view showing a semiconductor die assembled within the unitary housing.

The exemplification set out herein illustrates a preferred embodiment of the invention in one form thereof, and such exemplification is not intended to be construed as limiting in any manner.

DETAILED DESCRIPTION OF THE DRAWINGS

A cross-sectional side view of a unibody pressure transducer package is illustrated in FIG. 1. The unibody pressure transducer package or one piece housing has a body 10 which is molded from a polymer material. The polymer material can be any thermal plastic or thermal set material which is compatible with the environment in which the pressure transducer will be used. The unibody package has a base 11 with walls 12. A hole 14 exists in base 11. Walls 12 rise from base 11 forming an opening at the top of the walls. Leads 13 pass through wall 12 so that electrical contact can be carried from within walls 12 to outside of body 10.

FIG. 2 illustrates a plan view of the unibody pressure transducer package of FIG. 1. Polymer body 10 is illustrated as being circular in configuration. FIG. 2 illustrates four leads 13 passing through walls 12 of body 10. The four leads 13 are attached at a distal end to frame member 17. A hole is illustrated in frame member 17 which is useful in indexing the leadframe assembly comprising leads 13 and frame member 17. Note that one lead 13 has a notch 16 which is used as a mark to indicate which one of leads 13 is considered to be the primary lead. The portion of leads 13 which appear within the opening of the unibody pressure transducer package must be entirely free of molding material so that good electrical contact bonding will occur.

FIG. 3 is a cut away view of the one piece housing having a semiconductor die 20 assembled within the housing. Semiconductor die 20 is positioned over hole or opening 14 and is held in position by a bonding material 21. Bonding material 21 can be any suitable resilient elastic bonding material which will stress isolate semiconductor die 20 from stresses which might be induced by the one piece housing. Semiconductor die 20 is electrically coupled by conductors 23 to leads 13. Note that the portion of leads 13 which penetrate into the area where semiconductor die 20 is mounted is preferably covered with a passivation material 22 as is semiconductor die 20 in order to protect the leadframes and the die from moisture and other adverse environmental components. The large opening at the top of body 10 can be closed with a disk 24 in order to prevent foreign objects from entering into the area where semiconductor die 20 is located. However, disk 24 must have a hole 25.

Normally, the pressure to be measured acts on the top surface of semiconductor die 20 so that die 20 functions in a diaphram downward mode. Therefore, the pressure signal enters from the large opening in the top, if uncovered, or through hole 25, if disk 24 is in place, and opening 14 is the vent to atmosphere. If a vacuum is being monitored, then the vacuum is sensed through opening 14 and the vent to atmosphere is through hole 25.

By now it should be appreciated that there has been provided an improved unibody package suitable for housing a pressure transducer. The one piece housing avoids the necessity of having to assemble and seal parts such as in a two piece housing.

I claim:

1. A unibody pressure transducer package, comprising a base and walls surrounding the base to form the unibody package, the package being molded from a polymer material; a plurality of leads molded into the package and extending through the walls and an opening formed by the walls opposite from the base allows access to the package for installing a pressure transducer.

2. The transducer package of claim 1 wherein the polymer material is a thermoplastic.

3. A unibody pressure transducer package, comprising a circular base molded with walls surrounding the base, the base having an area adapted to receive a pressure transducer; and a plurality of leads molded into the walls and extending through the walls.

4. The transducer package of claim 3 wherein the area adapted to receive a pressure transducer has a hole in it, and the pressure transducer is a semiconductor transducer.

5. A pressure transducer within a unibody package, the unibody being a molded polymer housing having a base and walls surrounding the base with leads molded into and extending through the walls, and a semiconductor pressure transducer within the unibody electrically coupled to the leads.

* * * * *